(12) United States Patent
Zhang et al.

(10) Patent No.: US 9,807,866 B2
(45) Date of Patent: Oct. 31, 2017

(54) SHIELDING MOLD FOR ELECTRIC AND MAGNETIC EMI MITIGATION

(71) Applicant: Intel Corporation, Santa Clara, CA (US)

(72) Inventors: Zhichao Zhang, Chandler, AZ (US); Adel Elsherbini, Chandler, AZ (US); Robert L. Sankman, Phoenix, AZ (US); Kemal Aygun, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/954,632

(22) Filed: Nov. 30, 2015

(65) Prior Publication Data

US 2017/0156202 A1    Jun. 1, 2017

(51) Int. Cl.
*H05K 1/02* (2006.01)
*H05K 9/00* (2006.01)
*H05K 1/18* (2006.01)

(52) U.S. Cl.
CPC ........... *H05K 1/0216* (2013.01); *H05K 1/025* (2013.01); *H05K 1/181* (2013.01)

(58) Field of Classification Search
CPC ...... H05K 1/0216; H05K 1/025; H05K 1/181; H05K 9/0039; H05K 9/0022;
(Continued)

(56) References Cited

U.S. PATENT DOCUMENTS 5,639,989 A * 6/1997 Higgins, III .......... H01L 23/552
174/386
7,129,422 B2 * 10/2006 Arnold ................. H05K 9/0024
174/377
(Continued)

FOREIGN PATENT DOCUMENTS

JP    2001035973 A    2/2001
JP    2002363383 A    12/2002
(Continued)

OTHER PUBLICATIONS

"International Application Serial No. PCT/US2016/053410, International Search Report dated Dec. 28, 2016", 3 pgs.
(Continued)

*Primary Examiner* — Hoa C Nguyen
(74) *Attorney, Agent, or Firm* — Schwegman Lundberg & Woessner, P.A.

(57) ABSTRACT

An electronic package having a substrate that includes signal traces and ground traces; an electronic component mounted on an upper surface of the substrate such that the electronic component is electrically connected to the signal traces and the ground traces in the substrate; an insulating layer covering the electronic component and the upper surface of the substrate; and an electromagnetic interference shielding mold covering the insulation layer such that the electromagnetic interference shielding mold is electrically connected to the ground traces in the substrate. In some forms of the electronic package, the electromagnetic interference shielding mold is electrically connected to the ground traces through openings in the insulation layer.

11 Claims, 2 Drawing Sheets

(58) Field of Classification Search
CPC .... H05K 9/0024; H05K 9/0026; H05K 9/003; H05K 9/0073; H05K 9/0075; H05K 9/0081; H05K 9/0003; H01L 23/552
See application file for complete search history.

(56) References Cited

U.S. PATENT DOCUMENTS

| | | | | |
|---|---|---|---|---|
| 2002/0168798 | A1* | 11/2002 | Glenn | H01L 21/56 438/113 |
| 2004/0251522 | A1 | 12/2004 | Legaspi et al. | |
| 2010/0032815 | A1* | 2/2010 | An | H01L 23/3121 257/660 |
| 2011/0298103 | A1* | 12/2011 | Yoo | H01L 23/3121 257/659 |
| 2012/0104571 | A1* | 5/2012 | Yoo | H01L 23/552 257/659 |
| 2015/0076670 | A1* | 3/2015 | Pan | H01L 23/552 257/659 |
| 2015/0296667 | A1* | 10/2015 | Hirose | H01L 21/568 427/126.2 |
| 2016/0093795 | A1* | 3/2016 | Arai | H01L 23/552 257/422 |
| 2016/0240493 | A1* | 8/2016 | Lee | H01L 23/66 |
| 2016/0309628 | A1* | 10/2016 | Ghosh | H05K 9/0081 |
| 2016/0358862 | A1* | 12/2016 | Lee | H01L 23/552 |

FOREIGN PATENT DOCUMENTS

| | | |
|---|---|---|
| JP | 2006332161 A | 12/2006 |
| KR | 100575086 B1 | 4/2006 |

OTHER PUBLICATIONS

"International Application Serial No. PCT/US2016/053410, Written Opinion dated Dec. 28, 2016", 6 pgs.

* cited by examiner

SHIELDING MOLD FOR ELECTRIC AND MAGNETIC EMI MITIGATION

TECHNICAL FIELD

Embodiments described herein generally relate to an electronic package, and more particularly to an electronic package that provides electromagnetic shielding.

BACKGROUND

Electronic products (e.g., wearables, mobile phones, smart phones, tablet computers, etc.) are continually being designed to be more flexible, compact and portable. Therefore, it is extremely important to reduce the form factor, z-height and weight of the electronic devices that are included in mobile products.

One of the concerns that can arise as things are made smaller is signal integrity issues. As examples, channel impedance discontinuity and crosstalk are common issues that are continually addressed during high-speed package and PCB design.

In some electronic devices, signal crosstalk, reflection and loss are common issues that occur in conventional systems which include differential pairs of conductors. Signal crosstalk, reflection and loss may have negative design impacts by limiting bus design scaling (e.g., frequency, power, silicon real-estate, package layer-count and channel length).

Conventional solutions that seek to mitigate signal integrity issues typically require some form of design trade-off. One or more of these design trade-offs usually constrain enabling smaller and more flexible form factor high-speed packages and PCBs.

As a first example, high-speed packages and PCBs may increase the layer count and/or Z-height of the high-speed packages and PCBs. The number of signal routing layers and grounding layers may be increased to alleviate the signal integrity issues (e.g., due to breakout/congested routing areas or routing-over-void/split-plane areas).

As a second example, high-speed packages and PCBs may reduce routing density (i.e., increase in routing pitch). The layout of high-speed packages and PCBs may be optimized to reduce signal integrity issues by keeping interconnects with at least 2×-spacing away from one another to (i) reduce crosstalk; and (ii) have a transition to other routing layer to avoid routing over-void/split-plane areas.

As a third example, high-speed packages and PCBs may require an increase in power consumption. This increase in power consumption is typically combined with circuit patterns where active crosstalk cancellation, loss equalization and terminations are applied to mitigate crosstalk, reflection and loss.

Digital devices and analog devices commonly co-exist in a spatially close proximity in many electronic devices such as wearables, IOT devices, cellular phones, tablets and client PCs. Electromagnetic interference (EMI) typically occurs between devices with direct or harmonic frequency overlap.

The presence of direct or harmonic frequency overlap undesirably increases the risks for normal functionality of the electronic device. An EMI shield that is made from materials with good conductivity or magnetic permeability is usually used to reduce the EMI risks.

One of the current EMI shielding techniques that is commonly used includes incorporating a box shield. However, box shields typically have a minimum size constraint which can be difficult to adequately incorporate into smaller electronic devices.

Another current EMI shielding techniques that is commonly used includes incorporating a conformal shield. The conformal shield is usually added to a conventional electronic component covering mold by a sputtering, coating, plating or printing process to create a metal layer outside of the mold. However, a conformal shield requires an additional metal layer deposition process thereby adding unwanted costs.

Therefore, a need exists for an EMI shielding technique that reduces the effects of direct or harmonic frequency overlap. Reducing the effects of direct or harmonic frequency overlap may address channel impedance discontinuity and crosstalk issues within close proximity electronic components while minimizing any design trade-offs.

DESCRIPTION OF EMBODIMENTS

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Orientation terminology, such as "horizontal," as used in this application is defined with respect to a plane parallel to the conventional plane or surface of a wafer or substrate, regardless of the orientation of the wafer or substrate. The term "vertical" refers to a direction perpendicular to the horizontal as defined above. Prepositions, such as "on," "side" (as in "sidewall"), "higher," "lower," "over," and "under" are defined with respect to the conventional plane or surface being on the top surface of the wafer or substrate, regardless of the orientation of the wafer or substrate.

Figure 1:
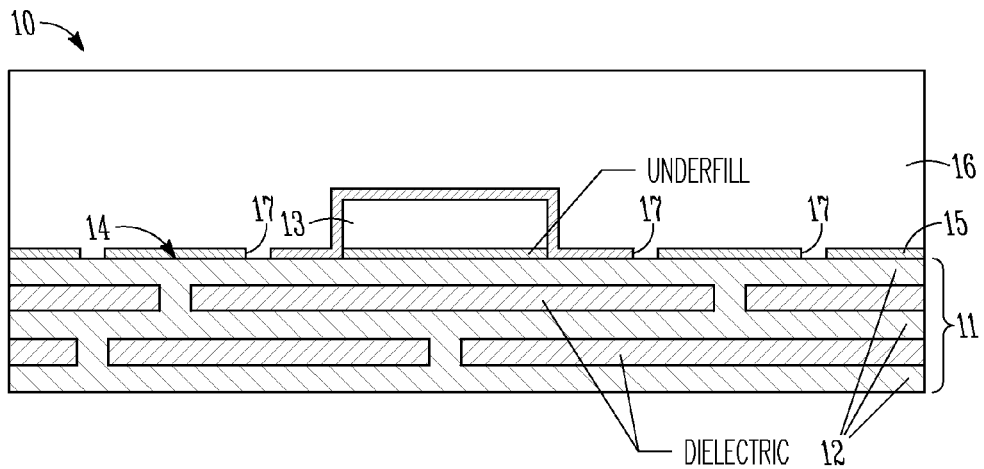
FIG. 1 illustrates a schematic side view of an example electronic package.

FIG. 1 illustrates a schematic side-view of an example electronic package 10. An electronic component 13 is mounted on an upper surface 14 of a substrate 11 such that the electronic component 13 is electrically connected to the signal and ground traces 12 in the substrate 11.

An insulating layer 15 covers the electronic component 15 and the upper surface 14 of the substrate 11. An electromagnetic interference shielding mold 16 covers the insulation layer 15 such that the electromagnetic interference shielding mold 16 is electrically connected to the ground traces 12 in the substrate 11.

In some forms, the electromagnetic interference shielding mold 16 is electrically connected to the ground traces 12 through openings 17 in the insulation layer 15. As an example, the openings 17 in the insulation layer 15 may be drilled openings. It should be noted that the openings 17 in the insulation layer 15 may be formed in any manner that is known now, or discovered in the future.

The electromagnetic interference shielding mold 16 may include a polymer mixed with magnetic materials that provide electromagnetic isolation. In addition, the electromagnetic interference shielding mold 16 may further include inorganic materials. As examples, the magnetic materials that are included in the electromagnetic interference shielding mold 16 may include at least one of cobalt, iron, nickel, copper, gold, silver and/or aluminum (among other types of materials or combinations of materials).

The type of materials that are included in the electromagnetic interference shielding mold 16 will depend in part on the degree of electrical and magnetic shielding that is required of the electromagnetic interference shielding mold 16 (among other factors). As an example, the electromagnetic interference shielding mold 16 may be formed by mixing regular mold materials with high conductivity metals (e.g., copper, aluminum, silver or gold) and high permeability materials (e.g., nickel or stainless steel) to insure that the electromagnetic interference shielding mold 16 provides adequate electrical and magnetic shielding.

In some forms, the insulation layer 15 may include a dielectric material. As an example, the dielectric material may include inorganic and organic materials.

As an example, the electromagnetic interference shielding mold 16 may include 60-90% conductive and magnetic materials and 10-40% epoxy resin (among other types of materials). In addition, the electromagnetic interference shielding mold 16 may also be partially formed of silica.

The electromagnetic interference shielding mold 16 may be useful in compact electronic devices by eliminating the space and additional manufacturing processes that are associated when including additional metal shielding in existing electronic devices. In addition, the electromagnetic interference shielding mold 16 may serve to attenuate voltage or current induced by emitters at a receiver. As an example, when highly conductive and highly permeable/high loss materials (e.g., ferrite compounds) are mixed with the mold material, the electromagnetic interference shielding mold 16 may serve to provide mechanical protection as well as provide EMI mitigation.

Some potential benefits of the electromagnetic interference shielding mold 16 include the electromagnetic interference shielding mold 16 being effective for both electrical and/or magnetic field reduction as well as potential power reduction. In addition, the electromagnetic interference shielding mold 16 may provide for increased space as well as process and cost savings by using the electromagnetic interference shielding mold 16 as a shield layer instead of fabricating a shield on or near the electronic component.

The electromagnetic interference shielding mold 16 may also reduce the need for through molding vias for grounding purposes thereby simplifying the manufacturing processes associated with fabricating the electronic package. In addition, the electromagnetic interference shielding mold 16 may provide the opportunity to tune the shielding effectiveness based on the material properties and thicknesses of the electromagnetic interference shielding mold 16.

It should be noted that the size, design and material properties of the electromagnetic interference shielding mold 16 will depend in part on (i) shield thickness; (ii) shield conductivity; (iii) shield permeability; (iv) electric and magnetic dissipation factors; (v) operating frequency of the various electronic components; and/or (vi) the relative distances between any emitters and receivers (among other factors).

Figure 2:
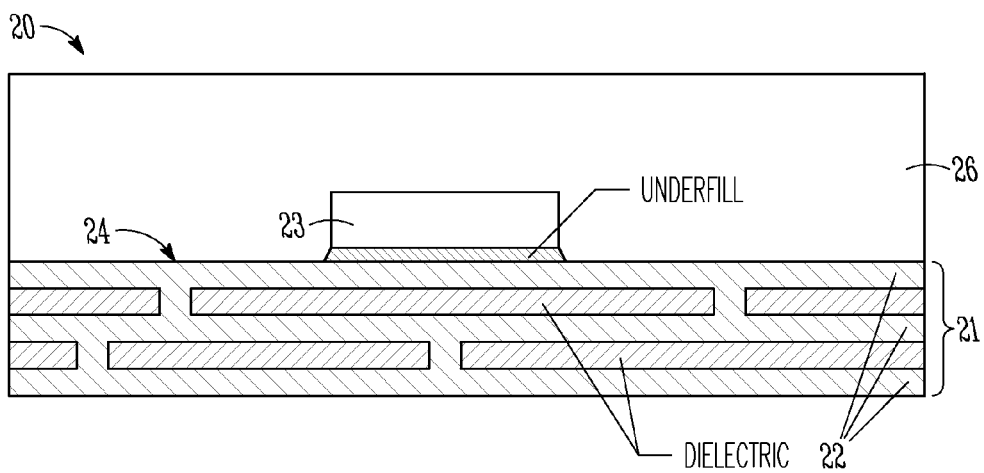
FIG. 2 illustrates a schematic side view of another example electronic package.

FIG. 2 shows another example electronic system 20. The electronic system 20 includes a substrate 21 that includes signal and ground traces 22. An electronic component 23 (e.g., a die) is mounted on an upper surface 24 of the substrate 21 such that the electronic component 23 is electrically connected to the signal and ground traces 22 in the substrate 21. A magnetic interference shielding mold 26 covers the upper surface 24 of the substrate 21 and the electronic component 23.

In some forms, the electronic package 20 further includes an insulating layer (not shown in FIG. 2) that covers the electronic component 23 and the upper surface 24 of the substrate 21. When the electronic package includes an insulating layer, the magnetic interference shielding mold 26 may be an electromagnetic interference shielding mold that is electrically connected to the ground traces 22 in the substrate 21 (e.g., through openings in the insulation layer). The insulation layer that is included in the electronic packaging 20 may be similar to the insulation layer 15 described above. In addition, the magnetic interference shielding mold 26 may be similar to none, one, some or all aspects to the electromagnetic interference shielding mold 16 described above.

As examples, the magnetic materials that are included in the magnetic interference shielding mold 26 include, but are not limited to at least one of cobalt, iron and nickel (among other types and combinations of materials). It should be noted that the types of materials that are included in the magnetic interference shielding mold 26 will depend in part on the size of the magnetic interference shielding mold 26 as well as the degree of magnetic shielding that is required of the magnetic interference shielding mold 26 (among other factors).

As an example, the magnetic interference shielding mold 26 may include 60-90% magnetic materials and 10-40% epoxy resin (among other types of materials). In addition, the magnetic interference shielding mold 26 may also be partially formed of silica.

Figure 3:
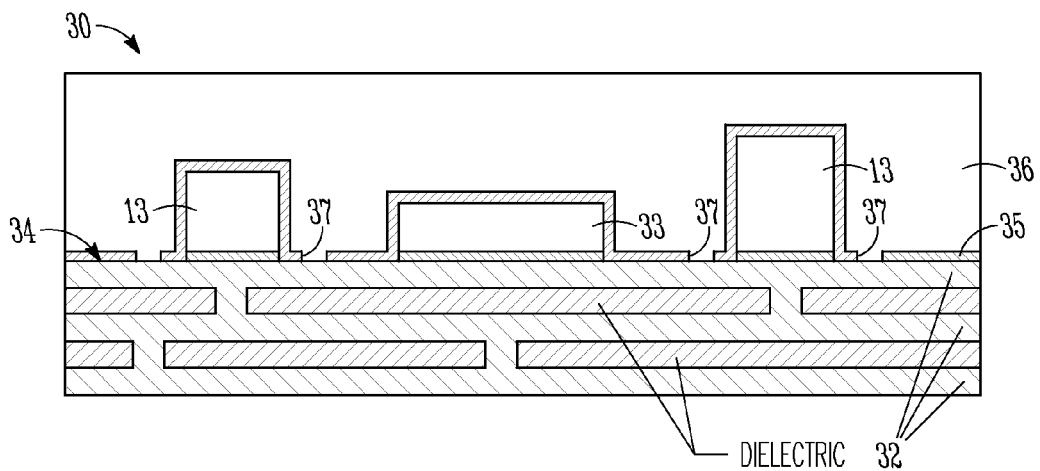
FIG. 3 illustrates a schematic side view of still another example electronic package.

FIG. 3 illustrates another example an electronic system 30. Electronic system 30 includes a substrate 31 that includes signal and ground traces 32. A plurality of electronic components 33 are mounted on an upper surface 34 of the substrate 31 such that the electronic components 33 are electrically connected to the signal and ground traces 32 in the substrate 31.

An insulating layer 35 covers the electronic components 33 and the upper surface 34 of the substrate 31. An electromagnetic interference shielding mold 36 covers the insulation layer 35 such that the electromagnetic interference shielding mold 36 is electrically connected to the ground traces 32 in the substrate 31.

In some forms, the electromagnetic interference shielding mold 36 is electrically connected to the ground traces 32 through openings 37 in the insulation layer 35. It should be noted that the insulation layer 35 may be similar to any of the insulation layers described above. In addition, the electromagnetic interference shielding mold 36 may be similar to any of the electromagnetic interference shielding molds 16 and/or magnetic interference shielding molds 26 described above.

It should be noted that the types of electronic components 33 that are included in the electronic package 30 will depend in part on the application where the electronic package 30 is to be used (among other factors). The electronic components 33 may all be the same, partially the same, or each electronic component 33 may be different.

The electronic packages 10, 20, 30 described herein may be suitable for use in a variety of electronic systems (e.g., wearables, IOT devices, cellular phones, tablets or client PCs—among other types of electronic systems). The electronic packages 10, 20, 30 described herein may facilitate the coexistence of digital devices and analog devices that are in close proximity within small-scale electronic devices.

The electronic packages 10, 20, 30 described herein may also reduce the effects of electromagnetic interference between devices with direct or harmonic frequency overlap thereby improving the likelihood of proper functionality. The electromagnetic and magnetic interference shielding molds that are used in the electronic packages 10, 20, 30 described herein may be made from materials with good electrical conductivity and/or magnetic permeability in order to reduce the risks of electromagnetic interference affecting the operation of the electronic packages 10, 20, 30.

Figure 4:
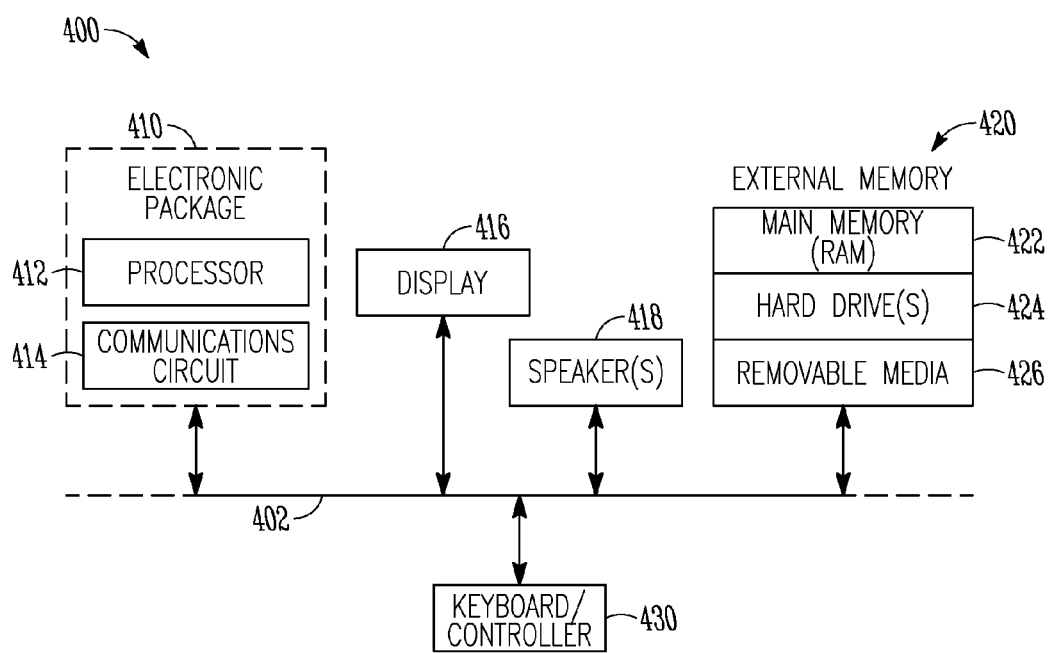
FIG. 4 is a block diagram of an electronic apparatus that includes the electronic packages described herein.

FIG. 4 is a block diagram of an electronic apparatus 400 incorporating at least one of the electronic packages 10, 20, 30 described herein. Electronic apparatus 400 is merely one example of an electronic apparatus in which forms of the electronic packages 10, 20, 30 may be used.

Examples of an electronic apparatus 400 include, but are not limited to, personal computers, tablet computers, mobile telephones, wearables, drones, game devices, MP3 or other digital music players, etc. In this example, electronic apparatus 400 comprises a data processing system that includes a system bus 402 to couple the various components of the electronic apparatus 400. System bus 402 provides communications links among the various components of the electronic apparatus 400 and may be implemented as a single bus, as a combination of busses, or in any other suitable manner.

An electronic assembly 410 that includes any of the electronic packages 10, 20, 30 as describe herein may be coupled to (or form part of) system bus 402. The electronic assembly 410 may include any circuit or combination of circuits. In one embodiment, the electronic assembly 410 includes a processor 412 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), multiple core processor, or any other type of processor or processing circuit.

Other types of circuits that may be included in electronic assembly 410 are a custom circuit, an application-specific integrated circuit (ASIC), or the like, such as, for example, one or more circuits (such as a communications circuit 414) for use in wireless devices like mobile telephones, tablet computers, laptop computers, two-way radios, and similar electronic systems. The IC can perform any other type of function.

The electronic apparatus 400 may also include an external memory 420, which in turn may include one or more memory elements suitable to the particular application, such as a main memory 422 in the form of random access memory (RAM), one or more hard drives 424, and/or one or more drives that handle removable media 426 such as compact disks (CD), flash memory cards, digital video disk (DVD), and the like.

The electronic apparatus 400 may also include a display device 416, one or more speakers 418, and a keyboard and/or controller 430, which can include a mouse, trackball, touch screen, voice-recognition device, or any other device that permits a system user to input information into and receive information from the electronic apparatus 400.

To better illustrate the electronic packages 10, 20, 30 disclosed herein, a non-limiting list of embodiments is provided herein:

To better illustrate the method and apparatuses disclosed herein, a non-limiting list of embodiments is provided here:

Example 1 includes an electronic package. The electronic package includes a substrate that includes signal traces and ground traces; an electronic component mounted on an upper surface of the substrate such that the electronic component is electrically connected to the signal traces and the ground traces in the substrate; an insulating layer covering the electronic component and the upper surface of the substrate; and an electromagnetic interference shielding mold covering the insulation layer such that the electromagnetic interference shielding mold is electrically connected to the ground traces in the substrate.

Example 2 includes the electronic package of claim 1, wherein the electromagnetic interference shielding mold is electrically connected to the ground traces through openings in the insulation layer.

Example 3 includes the electronic package of any one of examples 1 to 2, wherein the openings in the insulation layer are drilled openings.

Example 4 includes the electronic package of any one of examples 1 to 3, wherein the electromagnetic interference shielding mold includes a polymer mixed with conductive materials and magnetic materials that provide electromagnetic isolation.

Example 5 includes the electronic package of example 4, wherein the electromagnetic interference shielding mold further includes inorganic materials.

Example 6 includes the electronic package of example 4, wherein the materials that provide electromagnetic isolation include at least one of cobalt, iron, nickel, copper, gold, silver and aluminum.

Example 7 includes the electronic package of any one of examples 1 to 6, wherein the insulation layer includes a dielectric material.

Example 8 includes the electronic package of example 7, wherein the dielectric material includes inorganic and organic materials.

Example 9 includes the electronic package of any one of examples 1 to 8, wherein the electromagnetic interference shielding mold is 60-90% conductive and magnetic materials and 10-40% epoxy resin.

Example 10 includes an electronic package. The electronic package includes a substrate that includes signal traces and ground traces; an electronic component mounted on an upper surface of the substrate such that the electronic component is electrically connected to the signal traces and the ground traces in the substrate; and a magnetic interference shielding mold covering the upper surface of the substrate and the electronic component.

Example 11 includes the electronic package of example 10, and further including an insulating layer covering the electronic component and the upper surface of the substrate, wherein the magnetic interference shielding mold is an electromagnetic interference shielding mold that is electrically connected to the ground traces in the substrate.

Example 12 includes the electronic package of example 11, wherein the electromagnetic interference shielding mold is electrically connected to the ground traces through openings in the insulation layer.

Example 13 includes electronic package of any one of examples 11 to 12, wherein the insulation layer includes a dielectric material.

Example 14 includes the electronic package of any one of examples 10 to 13, wherein the magnetic interference shielding mold includes a polymer mixed with magnetic materials that provide magnetic isolation.

Example 15 includes the electronic package of any one of examples 10 to 14, wherein the magnetic interference shielding mold further includes inorganic materials.

Example 16 includes the electronic package of any one of examples 14 to 15, wherein the magnetic materials that provide magnetic isolation include at least one of cobalt, iron and nickel.

Example 17 includes the electronic package of any one of examples 10 to 16, wherein the magnetic interference shielding mold is 60-90% magnetic materials and 10-40% epoxy resin.

Example 18 includes an electronic package. The electronic package includes a substrate that includes signal traces and ground traces; a plurality of electronic components mounted on an upper surface of the substrate such that the electronic components are electrically connected to the signal traces and the ground traces in the substrate; an insulating layer covering the electronic components and the upper surface of the substrate; and an electromagnetic interference shielding mold covering the insulation layer such that the electromagnetic interference shielding mold is electrically connected to the ground traces in the substrate.

Example 19 includes the electronic package of example 18, wherein the electromagnetic interference shielding mold is electrically connected to the ground traces through openings in the insulation layer.

Example 20 includes the electronic package of any one of examples 18 to 19, wherein the electromagnetic interference shielding mold includes a polymer mixed with materials that provide electromagnetic isolation, wherein the electromagnetic interference shielding mold further includes inorganic materials, wherein the materials that provide electromagnetic isolation include at least one of cobalt, iron, nickel, copper, gold, silver and aluminum.

These and other examples and features of the present electronic device, solder compositions, and related methods will be set forth in part in the detailed description. This overview is intended to provide non-limiting examples of the present subject matter—it is not intended to provide an exclusive or exhaustive explanation. The detailed description is included to provide further information about the systems, and methods.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. An electronic package, comprising:
    a substrate that includes signal traces and ground traces, the substrate having a planar upper surface;
    an electronic component mounted on the planar upper surface of the substrate such that the electronic component is electrically connected to the signal traces and the ground traces in the substrate;
    an insulating layer covering the entire electronic component and the entire planar upper surface of the substrate; and
    an electromagnetic interference shielding mold covering the entire insulation layer such that the electromagnetic interference shielding mold extends through cylindrical drilled openings in the insulating layer to be electrically connected to the ground traces that are exposed from the planar upper surface of the substrate.

2. The electronic package of claim 1, wherein the electromagnetic interference shielding mold includes a polymer mixed with conductive materials and magnetic materials that provide electromagnetic isolation.

3. The electronic package of claim 2, wherein the electromagnetic interference shielding mold further includes inorganic materials.

4. The electronic package of claim 2, wherein the materials that provide electromagnetic isolation include at least one of cobalt, iron, nickel, copper, gold, silver and aluminum.

5. The electronic package of claim 1, wherein the insulation layer includes a dielectric material.

6. The electronic package of claim 5, wherein the dielectric material includes inorganic and organic materials.

7. The electronic package of claim 1, wherein the electromagnetic interference shielding mold is 60-90% conductive and magnetic materials and 10-40% epoxy resin.

8. An electronic package, comprising:

a substrate that includes signal traces and ground traces;

a plurality of electronic components mounted on an upper surface of the substrate such that the electronic components are electrically connected to the signal traces and the ground traces in the substrate;

an insulating layer entirely covering each of the electronic components and the entire upper surface of the substrate, wherein the insulating layer has a substantially uniform thickness; and an electromagnetic interference shielding mold covering the insulation layer such that the electromagnetic interference shielding mold extends through cylindrical drilled openings in the insulating layer to be electrically connected to the ground traces in the substrate.

9. The electronic package of claim 8, wherein the electromagnetic interference shielding mold includes a polymer mixed with materials that provide electromagnetic isolation, wherein the electromagnetic interference shielding mold further includes inorganic materials, wherein the materials that provide electromagnetic isolation include at least one of cobalt, iron, nickel, copper, gold, silver and aluminum.

10. The electronic package of claim 9, wherein the magnetic materials that provide magnetic isolation include at least one of cobalt, iron and nickel.

11. The electronic package of claim 8, wherein the magnetic interference shielding mold is 60-90% magnetic materials and 10-40% epoxy resin.

\* \* \* \* \*